(12) United States Patent
Hung

(10) Patent No.: US 7,108,051 B2
(45) Date of Patent: Sep. 19, 2006

(54) CPU HEAT DISSIPATING UNIT

(76) Inventor: Kuo-Chuan Hung, P.O. Box No. 6-57, Junghe, Taipei 235 (TW)

( * ) Notice: Subject to any disclaimer, the term of this patent is extended or adjusted under 35 U.S.C. 154(b) by 151 days.

(21) Appl. No.: 10/846,586

(22) Filed: May 17, 2004

(65) Prior Publication Data

US 2005/0252638 A1 Nov. 17, 2005

(51) Int. Cl.
*H05K 7/20* (2006.01)
(52) U.S. Cl. .................. 165/122; 165/80.3; 174/16.3; 361/687; 361/695
(58) Field of Classification Search ............. 165/80.3, 165/121, 122, 185; 174/16.3; 257/722; 361/690, 695, 697, 687; 454/184
See application file for complete search history.

(56) References Cited

U.S. PATENT DOCUMENTS

| | | | |
|---|---|---|---|
| 6,462,948 B1 * | 10/2002 | Leija et al. ................. | 361/697 |
| 6,504,718 B1 * | 1/2003 | Wu ............................ | 361/695 |
| 2003/0016496 A1 * | 1/2003 | Kim et al. ................... | 361/695 |

* cited by examiner

*Primary Examiner*—Leonard R. Leo

(57) ABSTRACT

A CPU heat dissipating unit for assembly into a 1U industrial computer, wherein, used to improve the effect of dissipating heat, mainly consisting of a cover unit, a tunnel unit and a heat dissipating fin. The cover unit is assembled to an upper side of a power supply unit, forming a ventilation channel between them. A heat dissipating unit is assembled on an upper side of the CPU and stored suitably into one side of the tunnel unit, while a cooling fan is assembled on the other side, thus providing quick dissipation of heat produced by the CPU.

4 Claims, 8 Drawing Sheets

CPU HEAT DISSIPATING UNIT

BACKGROUND OF THE INVENTION (a) Field of Invention

The present invention relates a CPU heat dissipating unit in a casing of 1U (1.75.inches.times.1) thin industrial computer, assembled to upgrade the heat dissipating process of a CPU, consisting of a covering unit, a tunnel unit and a cooling fan.

(b) Description of the Prior Art

The body of an industrial computer is considerably smaller. Due to a CPU consistently processing, it not only consumes a large quantity of electricity, but also produces a large amounts of heat. Since the room in a casing to store heat is restricted, therefore the methods for dissipating heat are alike, refer to FIG. 1. A heat dissipating fin B is assembled above the CPU to direct the heat produced therein, then by assembling a cooling fan in the casing unit or on the heat dissipating fin thereafter, the heat is directed out of the casing unit. The heat dissipating fin B concentrates a large amount of heat in a short period of time, and is constantly built up. Since the wind released by the cooling fans C do not run in the same direction, moreover are obstructed by the other components in the computer, concentrated heating points are created in the casing and causes difficulty in dissipating heat. A number of cooling fans can be assembled in the casing to force the concentrated heating points away, but due to the lack of ventilation, the temperature of the other electronic components are influenced, causing the whole computer to be unstable. Therefore with the disadvantages mentioned in the above prior art, amendments is necessary.

SUMMARY OF THE INVENTION

A primary objective of the present invention is to provide a heat dissipating unit that can quickly dissipate a large quantity of heat energy away from the computer.

The present invention mainly consists of a cover unit assembled on an upper side of a power supply unit, forming a ventilation channel there between, in addition, an opening is formed on a side of the cover unit, corresponding to the size for an opening of a tunnel unit. The tunnel unit is n-shaped and assembled to the opening to suit a corresponding heat dissipating fin.

A bending plate bent inward is formed on each side of the tunnel unit, enabling the heat dissipating fin to be suitably covered and secured by the tunnel unit, creating one ventilation channel, thereafter, assembling a cooling fan at a rear end of the ventilation channel.

In the aforesaid structure, the cover unit is secured to the upper side of the power supply unit. Due to the outer casing of the power supply unit becoming an obstruction when inside the cover unit, the ventilation channel connects with the central processing unit. The central processing unit is situated at one end, while a cooling fan is assembled at the other end, allowing heat produced by the central processing unit to be directed out of the casing unit. This prevents the heat from returning to the casing unit and blocked by the other computer components forming concentrated heating points, influencing the whole performance of the computer.

To enable a further understanding of the said objectives and the technological methods of the invention herein, the brief description of the drawings below is followed by the detailed description of the preferred embodiments.

DETAILED DESCRIPTION OF THE PREFERRED EMBODIMENT

Figure 1:
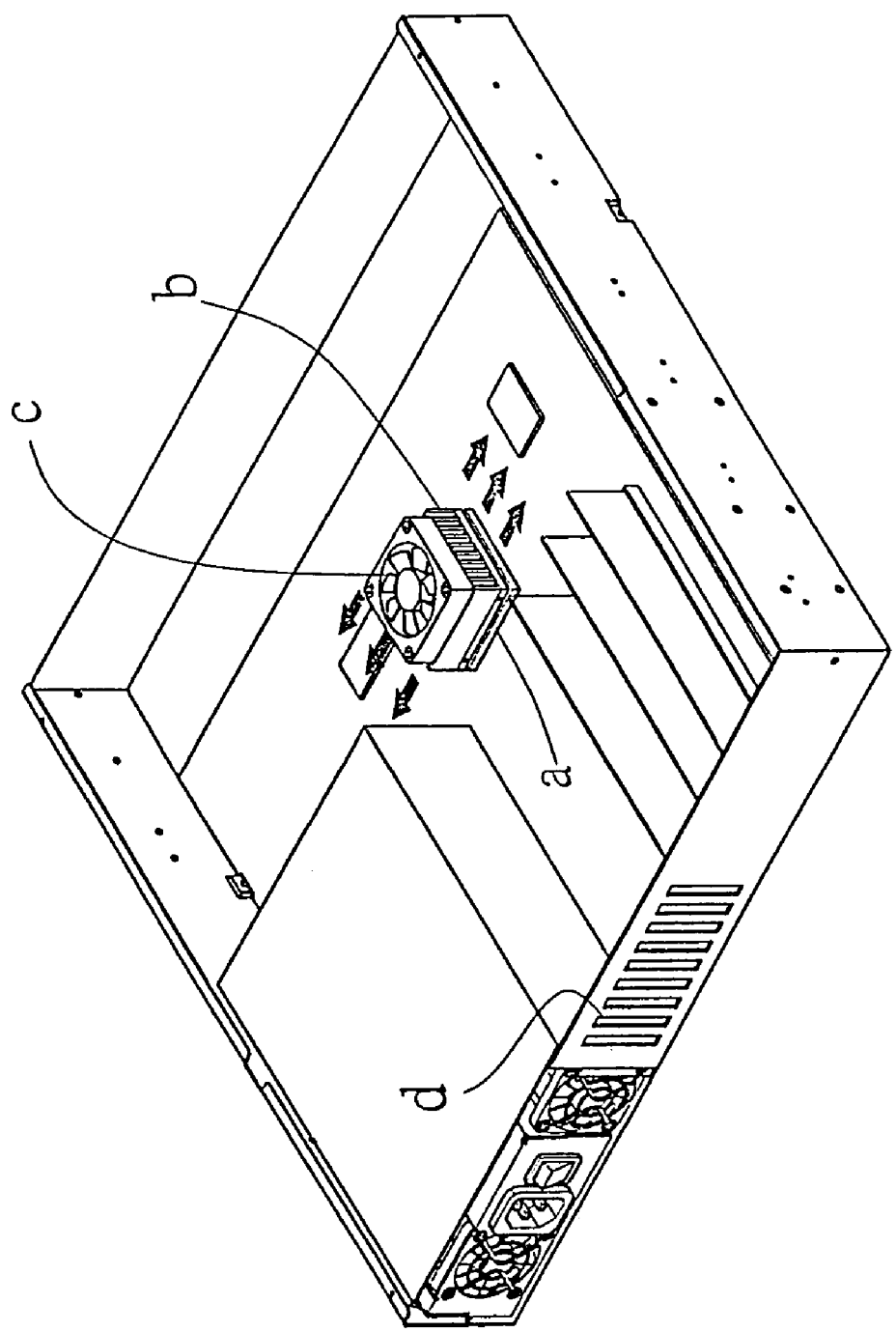
FIG. 1 shows a perspective schematic view of the conventional CPU heat dissipating unit.
Figure 2:
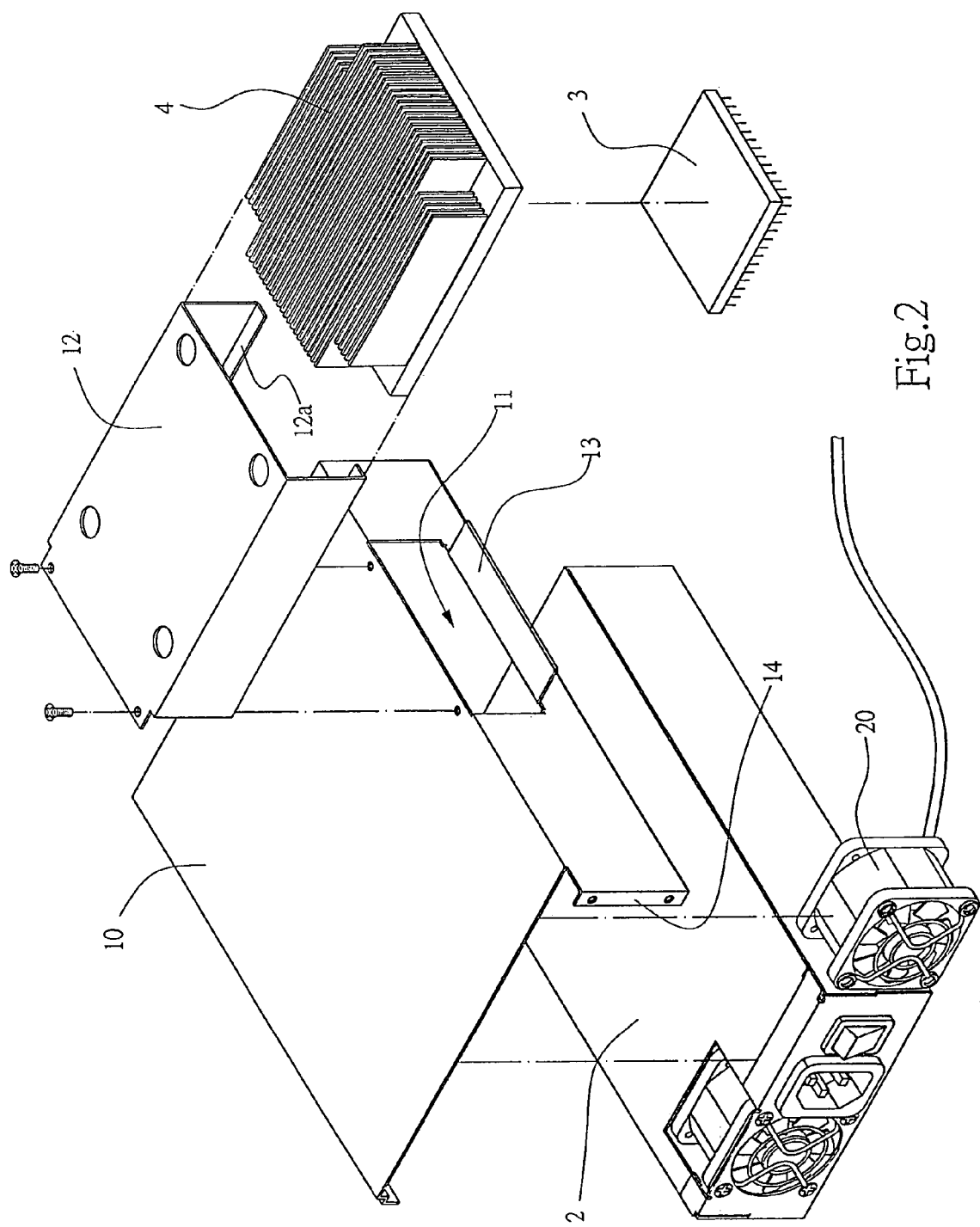
FIG. 2 shows an exploded view according to the present invention.
Figure 3:
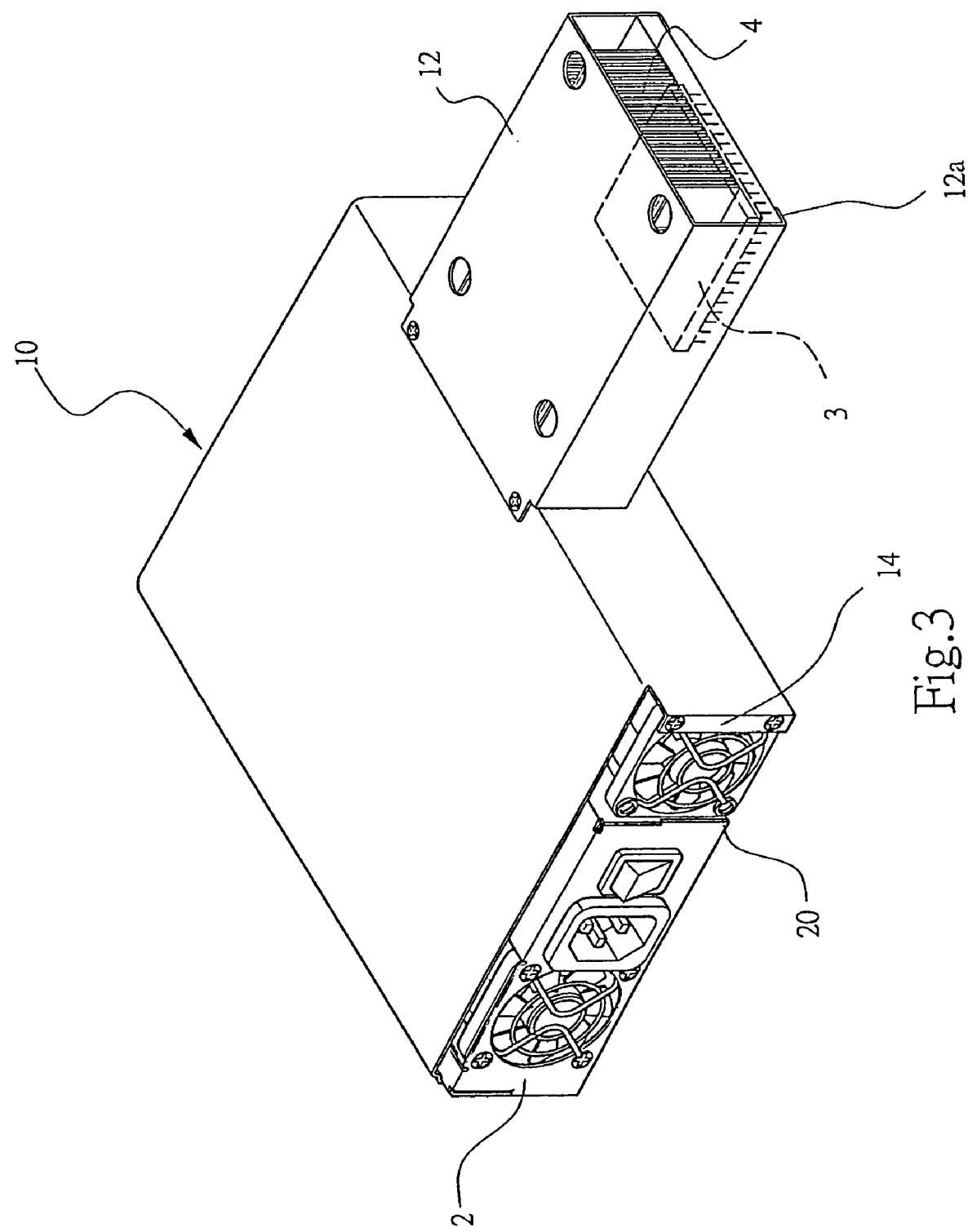
FIG. 3 shows a perspective schematic view according to the present invention.
Figure 4:
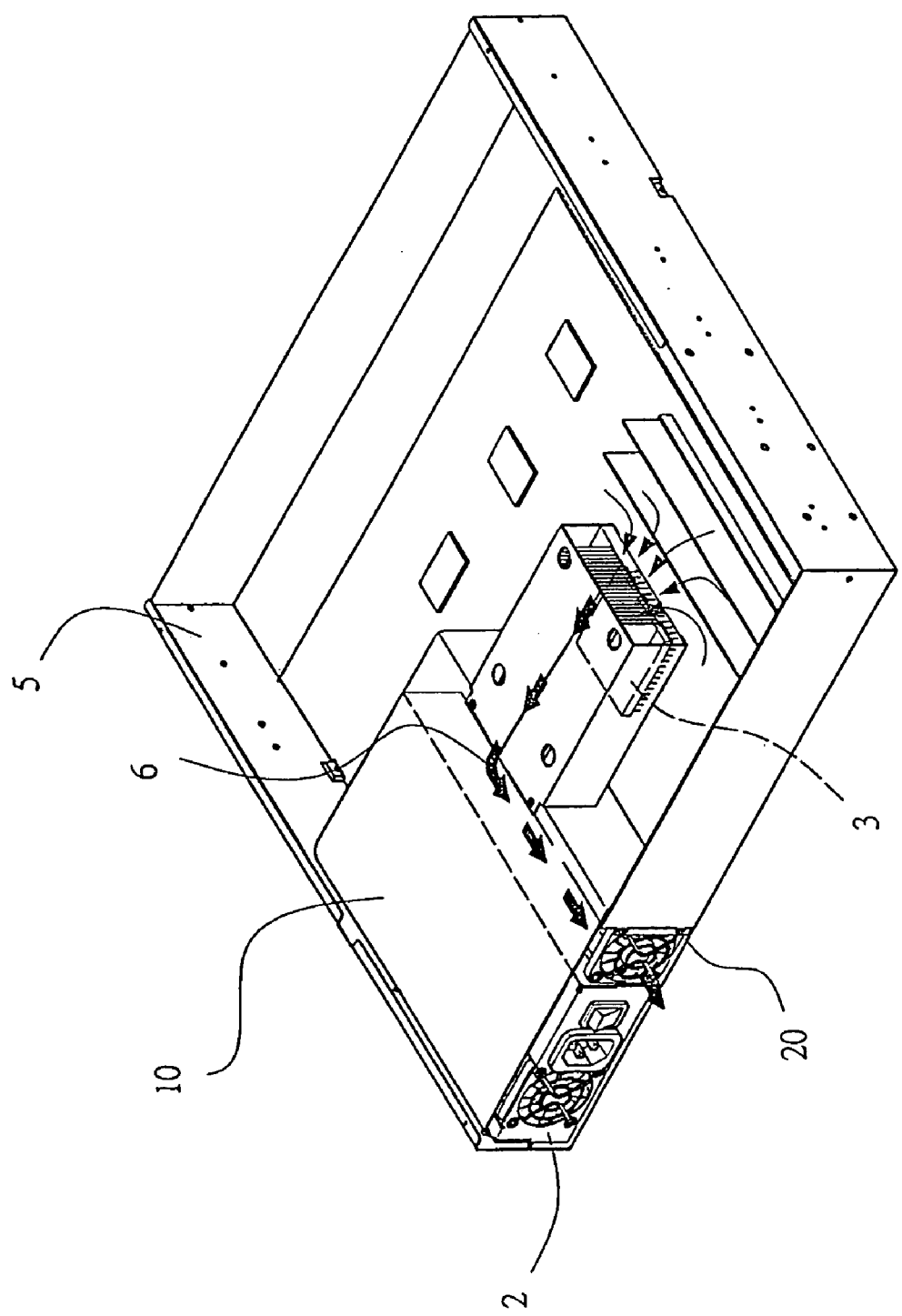
FIG. 4 shows a perspective schematic view according to the present invention.

As shown in FIGS. 2, 3 and 4, a CPU (central processing unit) heat dissipating unit in a industrial computer includes a cover unit 10 and a cooling fan 20, wherein, the cover unit 10 is assembled on a upper side a power supply unit 2, permitting a ventilation channel 6 to form between the cover unit 10 and the power supply unit 2, in addition, an opening 11 is formed on a side of the cover unit 10, corresponding to the size for an opening of a tunnel unit 12. The tunnel unit 12 is assembled onto the opening 11, enabling connection with the central processing unit 3; in addition, a separating plate 13 is formed at a lower end of the open 11 to prevent the heat from a heat dissipating fin 4 to bypass there through. A securing plate 14 that attach to a casing unit 5 is assembled to a rear side of the cover unit 10 and to a side of the opening 11 respectively. The tunnel unit 12 is n-shaped, corresponding in size to the heat dissipating fin 4, moreover, a bending plate 12a bent inward is formed on each side of the tunnel unit 12, enabling the heat dissipating fin 4 to be suitably covered and secured by the tunnel unit 12.

A cooling fan 20 is assembled into a rear opening behind the cover unit 10, and positioned to draw air away, altering into an exhaust fan when in combination with the cover unit 10.

As shown in FIG. 4, the cover unit 10 is secured into a suitable position in the casing unit 5. Due to the outer casing of the power supply unit 2 becoming an obstruction when inside the covering unit 10, the central processing unit is assembled on one end of the ventilation channel 6 while a cooling fan 20 is assembled on the other end. The heat produced is dissipated out of the casing unit 5 directly and prevents concentrated heat points from forming, due to obstruction of the other computer components and influencing the whole performance.

Figure 5:
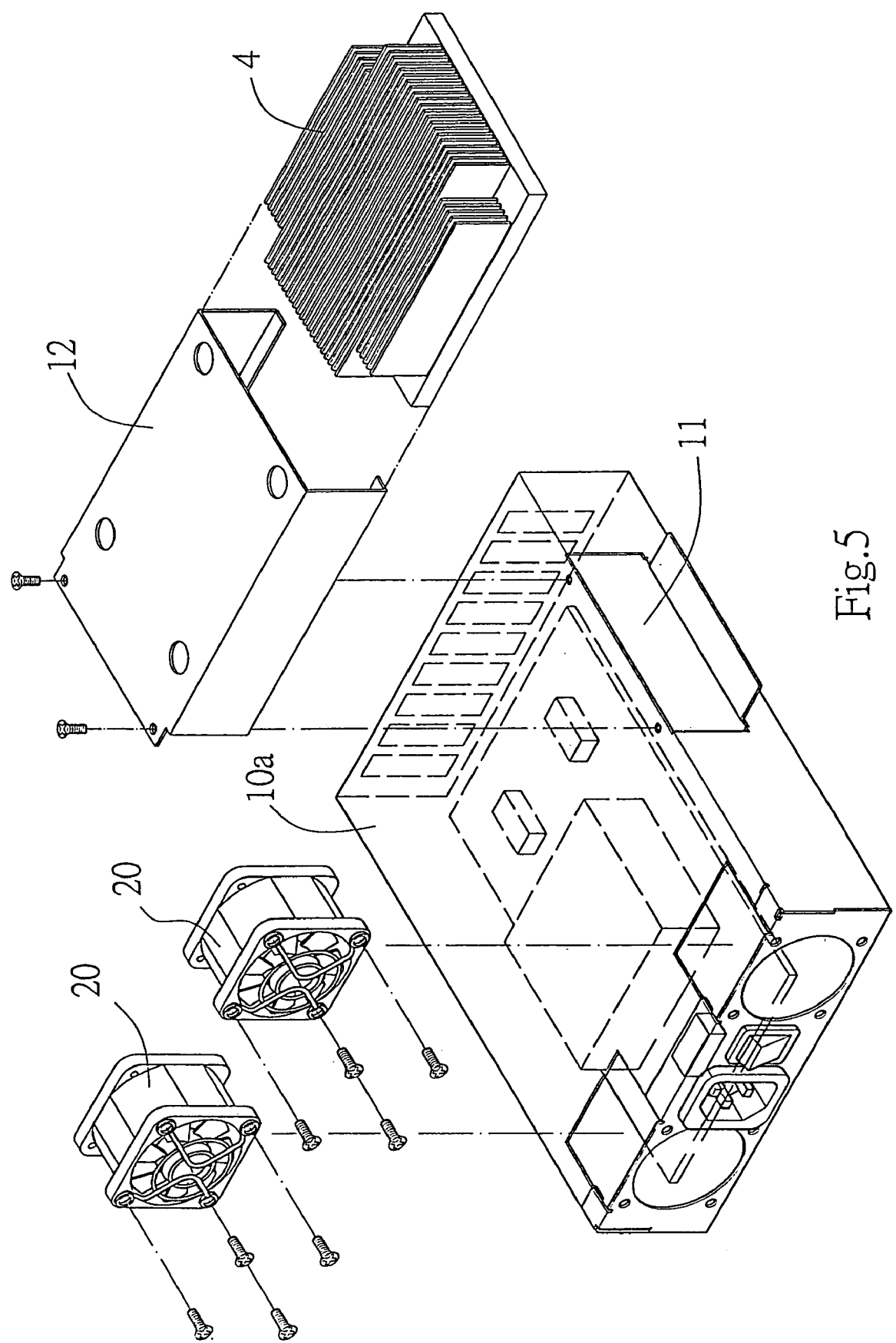
FIG. 5 shows an exploded view according to another form of the present invention.
Figure 6:
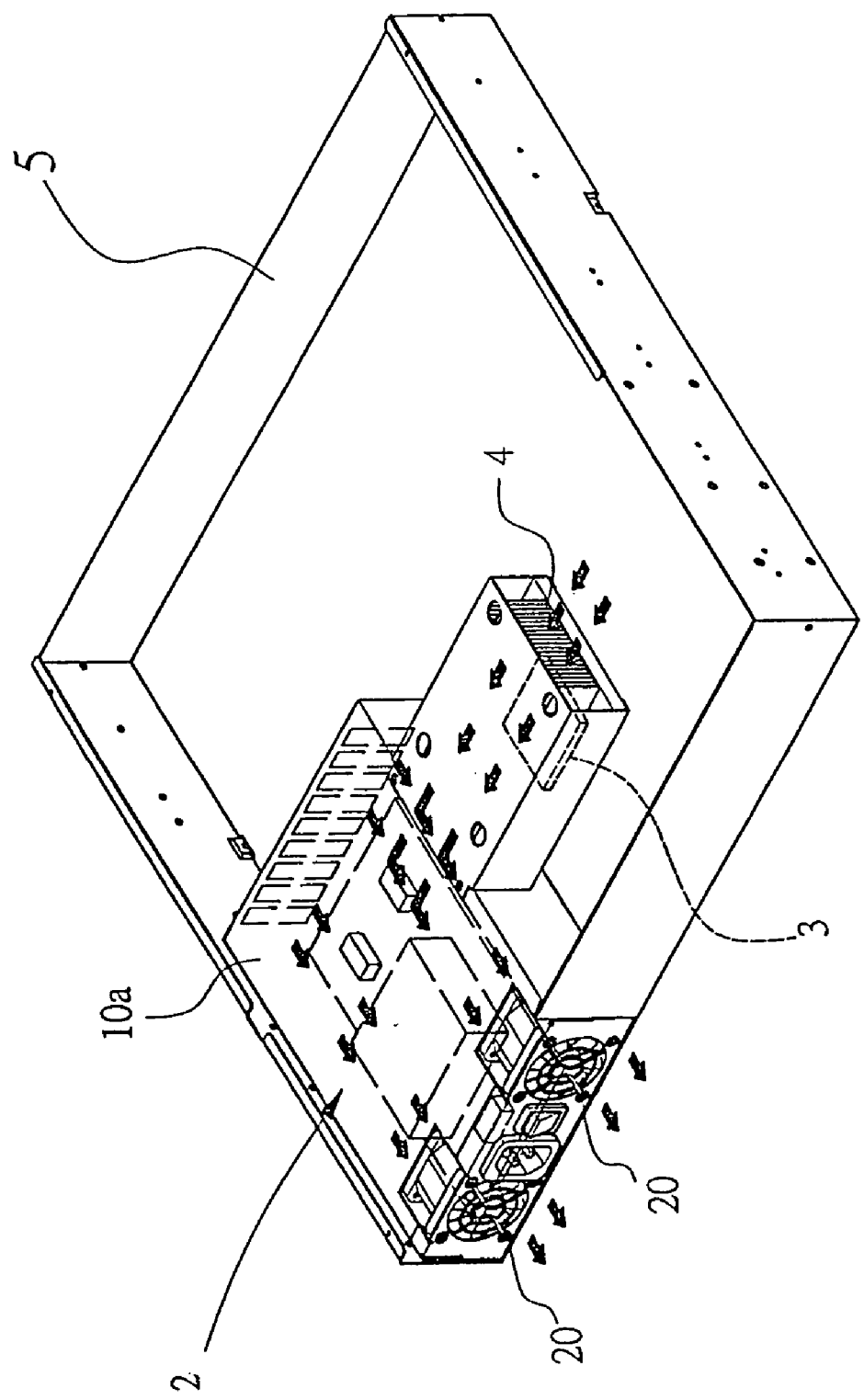
FIG. 6 shows a perspective schematic view to another form of the present invention.

As shown in FIGS. 5 and 6, the cover unit 10 can be created into a power supply casing 10a with the opening 11 formed on a side. The corresponding tunnel unit 12 that suitably covers the heat dissipating fin 4 can be assembled with the opening 11. The heat dissipating fin 4 can be assembled on the upper side of the central processing unit 3, thus joining a lower side of the heat dissipating fin with the upper side of the central processing unit. A plurality of cooling fans 20 is assembled at a rear end of the power supply casing unit 10a. The power supply casing 10a is assembled suitably in the casing unit 5, allowing the ventilation channel 6 to connect with the CPU 3, thus allowing the heat produced by the CPU 3 to quickly draw away from the casing unit 5 thereafter, preventing the other computer components to become obstructions, and creating concentrated heat points, thus influencing the whole performance.

Figure 7A:
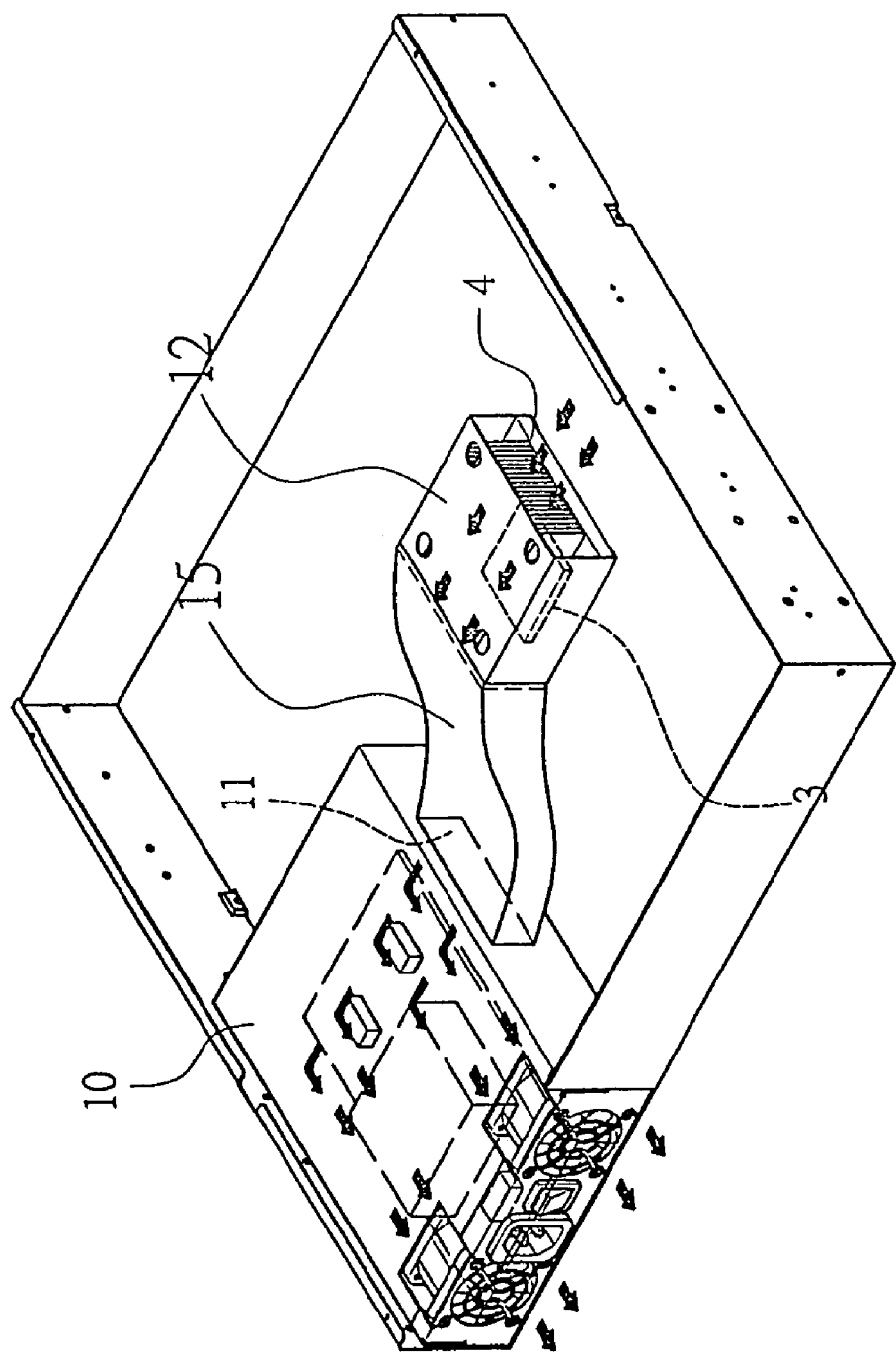
FIG. 7A shows a perspective schematic view to another form of the present invention.
Figure 7B:
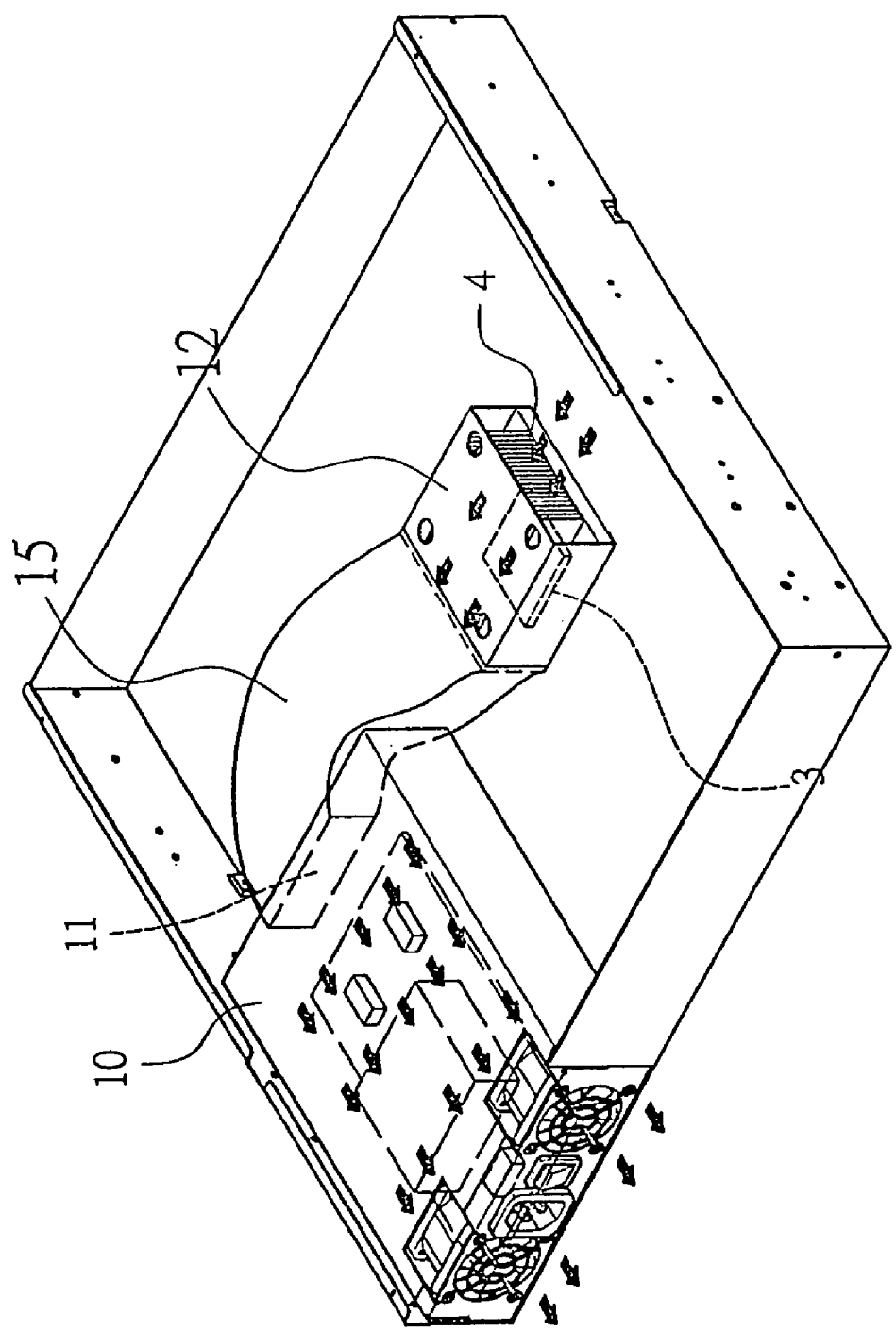
FIG. 7B shows a perspective schematic view to another form of the present invention.

A shown in FIGS. 7A and 7B, a soft connecting tube 15 is assembled with the CPU heat dissipating unit, suitable for use when the opening 11 on the side of the cover unit 10 is not able to form a straight line with the CPU 3. After the heat dissipating fin 4 is suitably covered by the tunnel unit 12, one end of the soft connecting tube 15 is secured to an opening of the tunnel unit 12 and the other end is secured to the opening 11 of the cover unit 10, thus achieving quick dissipation of heat and saving the capital for reconstructing a cover unit 10.

In conclusion, the assembly of the cover unit 10 on the upper side of the power supply unit 2 enabling a ventilation channel 6 to form, thus truly achieving fast dissipation of heat from the casing and finally creating improvement and operability.

It is of course to be understood that the embodiments described herein is merely illustrative of the principles of the invention and that a wide variety of modifications thereto may be effected by persons skilled in the art without departing from the spirit and scope of the invention as set forth in the following claims.

What is claimed is:

1. A CPU heat dissipating unit for assembling into a 1U industrial computer used to dissipating heat comprising:

a cover unit, a tunnel unit and a cooling fan, wherein, the cover unit is assembled on an upper side of a power supply unit, forming a ventilation channel there between, in addition, an opening is formed on a side of the cover unit, corresponding to an opening of the tunnel unit, thereby allowing the tunnel unit to connect with a CPU;

a separating plate is formed at a lower side of the opening and a securing plate that attaches to a casing of said power supply unit is assembled to a rear side of the cover unit and to a side of the opening respectively, furthermore, the cooling fan is assembled at one end of the ventilation channel, thereby drawing heat produced by the CPU.

2. The CPU heat dissipating unit as recited in claim 1, wherein the power supply unit casing attaches to the cover unit as a casing for the power supply unit.

3. The CPU heat dissipating unit as recited in claim 1, wherein the tunnel unit is n-shape, corresponding in size to a heat dissipating fin, moreover, a bending plate bent inward is formed on each side of the tunnel unit, thereby enabling the heat dissipating fin to be suitably covered by the tunnel unit.

4. The CPU heat dissipating unit as recited in claim 1, wherein the cover unit and the tunnel unit can be connected together with a soft connecting tube;

one end of the soft connecting tube is secured to an opening of the tunnel unit and the other end is secured to the opening of the cover unit.

* * * * *